United States Patent [19]
Kirk

[11] Patent Number: 5,341,051
[45] Date of Patent: Aug. 23, 1994

[54] N-DIMENSIONAL BASIS FUNCTION CIRCUIT

[75] Inventor: David B. Kirk, South Pasadena, Calif.

[73] Assignee: California Institute of Technology, Pasadena, Calif.

[21] Appl. No.: 981,763

[22] Filed: Nov. 25, 1992

[51] Int. Cl.$^5$ .............................. H03F 3/45
[52] U.S. Cl. .................. 307/494; 307/355; 307/364; 330/257
[58] Field of Search ............... 307/490, 529, 364, 355, 307/354, 608, 494; 330/257, 288

[56] References Cited

U.S. PATENT DOCUMENTS

| | | | |
|---|---|---|---|
| 4,506,171 | 3/1985 | Evans et al. | 307/354 |
| 4,749,880 | 7/1988 | Kobatake | 307/355 |
| 4,791,324 | 12/1988 | Hodapp | 307/490 |
| 4,818,897 | 4/1989 | Krenik | 307/490 |
| 5,012,139 | 4/1991 | Susak et al. | 307/490 |
| 5,099,156 | 3/1992 | Delbrück et al. | 307/529 |

OTHER PUBLICATIONS

Alspector, J., J. W. Gannett, S. Haber, M. B. Parker, and R. Chu, "A VLSI-Efficient Technique for Generating Multiple Uncorrelated Noise Sources and Its Application to Stochastic Neural Networks," IEEE Transactions on Circuits and System, vol. 38, No. 1, pp. 109-123, Jan., 1991.

Alspector, J., B. Gupta, and R. B. Allen, "Performance of a Stochastic Learning Microchip," in *Advances in Neural Information Processing Systems*, vol. 1, Denver, Colo., Nov. 1988. D. S. Touretzky, ed., Morgan Kauffman Publishers, 1989, pp. 748-760.

Delbrück, Tobi, "'Bump' Circuits for Computing Similarity and Dissimilarity of Analog Voltages," Caltech Computation and Neural Systems Memo No. 10, May 23, 1991.

Dembo, A., and T. Kailath, "Model-Free Distributed Learning," IEEE Transactions on Neural Networks, vol. 1, No. 1, pp. 58-70, Mar. 1990.

Kirk, Douglas, Kurt Fleischer, and Alan Barr, "Constrained Optimization Applied to the Parameter Setting Problem for Analog Circuits," IEEE Neural Information Processing Systems 1991 (NIPS91), Morgan Kaufman, San Diego, 1991.

Platt, John, "Constrained Optimization for Neural Networks and Computer Graphics," Ph.D. Thesis, California Institute of Technology, Caltech-CS-TR-89-07, Jun., 1989.

Umminger, Christopher B., and Steven P. DeWeerth, "Implementing Gradient Following in Analog VLSI," Advanced Research in VLSI, MIT Press, Boston, Mar. 1989, pp. 195-208.

*Primary Examiner*—Timothy P. Callahan
*Assistant Examiner*—My-Trang Nu Ton
*Attorney, Agent, or Firm*—Blakely, Sokoloff, Taylor & Zafman

[57] ABSTRACT

The circuit generates an output value of an N-dimensional basis function. The circuit includes a string of sub-circuits, each sub-circuit computing a one-dimensional basis function. Each lower dimension sub-circuit is coupled to the adjacent higher dimension circuit, such that the current output is utilized as the input bias current to the adjacent higher dimension circuit. The coupling of sub-circuits in this manner provides the computation of the product of the 1-dimension basis functions produced by each of the sub-circuits.

24 Claims, 8 Drawing Sheets

N-DIMENSIONAL BASIS FUNCTION CIRCUIT

BACKGROUND OF THE INVENTION

1. Field of the Invention

The present invention relates to the evaluation of an N-dimensional basis function. More particularly, the present invention relates to a VLSI analog circuit which evaluates N-dimensional basis functions.

2. Art Background

Analog circuits which generate a correlation output to signal inputs are well known. For example, analog adders and multipliers generate an output based on input such as voltage or current. One such circuit is referred to as the "bump" circuit. Delbrück disclosed a bump circuit which computes generalized measures of similarity or dissimilarity of two voltage inputs. For example, if the circuit determines the similarity of two inputs, the similarity outputs from the circuits given as currents become large when the input voltages are close to each other. As such, it computes a basis function in a single dimension. An equation representative of the "bump" circuit is shown below.

$$I_{out} = \frac{I_0}{1 + \frac{4}{\omega} \cosh^2\left(\frac{k\Delta V}{2}\right)}$$

For further information regarding sub-threshold and above-threshold circuits, see U.S. Pat. No. 5,099,156, "Sub-threshold MOS Circuits for Correlating Analog Input Voltages" and Delbrück, "Bump Circuits for Computing Similarity and Dissimilarity of Analog Voltages", California Institute of Technology Computation and Neural Systems Program, CNS Memo No. 10, May 23, 1991.

However, with increasing sophistication in the design of analog circuits for application in certain technology areas, such as neural networks, it is desirable to produce a circuit which implements a basis function in multiple dimensions.

SUMMARY OF THE INVENTION

It is therefore an object of the present invention to produce a basis function in N-dimensions where N is greater than 1.

It is also an object of the present invention to implement a smooth error metric for function minimization.

It is also an object of the present invention to provide a basis function for function interpolation in neural networks that operate by summing a collection of basis functions.

It is further an object of the present invention to provide a circuit which has the ability to project a higher dimension space onto a lower dimension space.

The present invention provides a circuit for computing a basis function in N-dimensions where N is greater than 1. The circuit includes a first sub-circuit representative of a first dimension which computes similarities between two input voltages producing a one-dimensional basis function. The first sub-circuit generates as part of its output an output current. Additional sub-circuits representative of additional dimensions also compute a similarity between two input voltages producing a one dimensional basis function. The sub-circuits are connected in series wherein the output current of a lower dimension sub-circuit is provided as the input bias current to the adjacent higher dimension sub-circuit. The input bias current to the first dimensional sub-circuit is preferably set to a predetermined value. This coupling of sub-circuits provides the computation of the product of the 1-dimensional basis functions produced by the sub-circuits. In one embodiment the coupling of the output current of the lower dimensional sub-circuit and the bias current input to the higher dimensional sub-circuit is achieved using a current mirror. In an alternate embodiment the current mirror is controlled by a scale factor such that the current input as the bias current to the higher dimensional sub-circuit can be varied or scaled by the scale factor. In another alternate embodiment a bias current is added to the current received via the current mirror, which is independent of the scale factor.

BRIEF DESCRIPTION OF THE DRAWINGS

The objects, features and advantages of the present invention will become apparent to one skilled in the art from reading the following detailed description in which.

DETAILED DESCRIPTION OF THE INVENTION

The following provides a description of an N-dimensional bump circuit which provides a basis function in N-dimensions. In the following description for purposes of explanation numerous details are set forth such as components, current, voltage levels and the like in order to provide a thorough understanding of the present invention. However, it will be apparent to one skilled in the art that these specific details are not required in order to practice the invention. In other instances well known electrical structures and circuits are shown in block diagram form in order not to obscure the present invention unnecessarily.

Figure 1A:
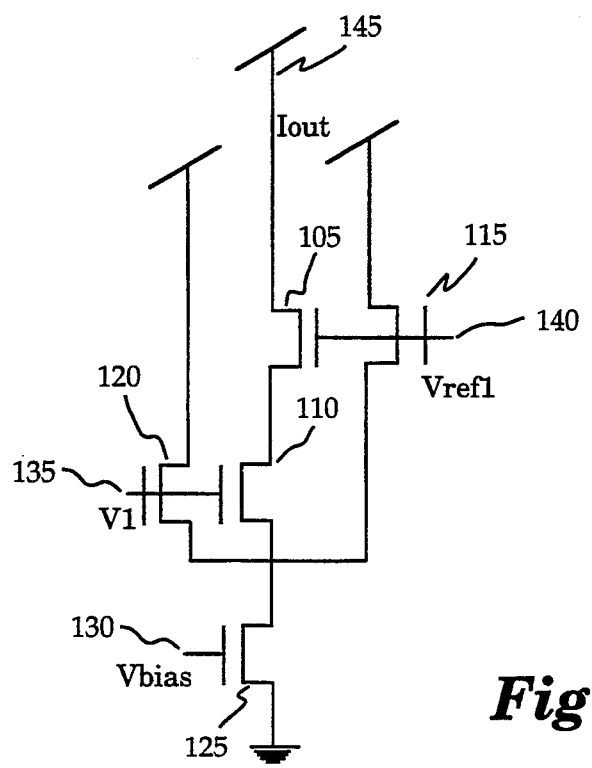
FIGS. 1a–1c are circuit diagrams of a prior art bump circuit.
Figure 1C:
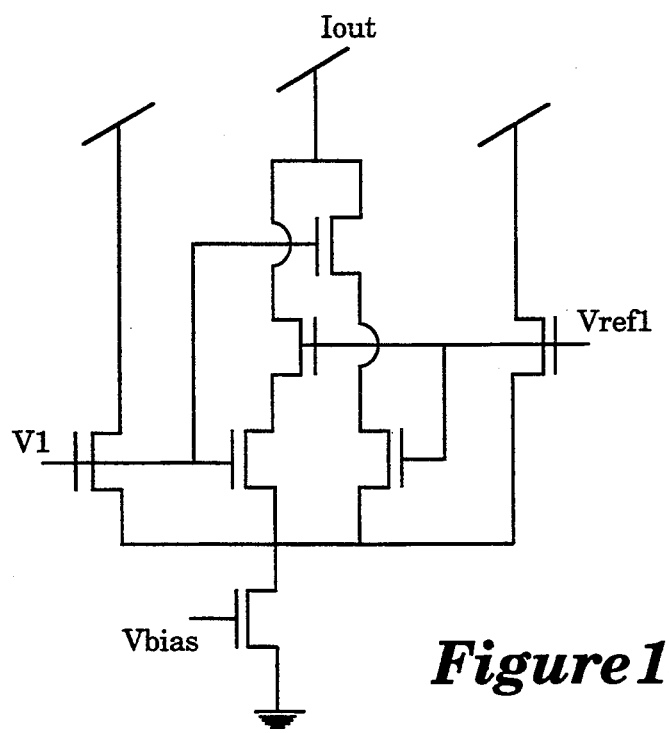
Figure 1B:
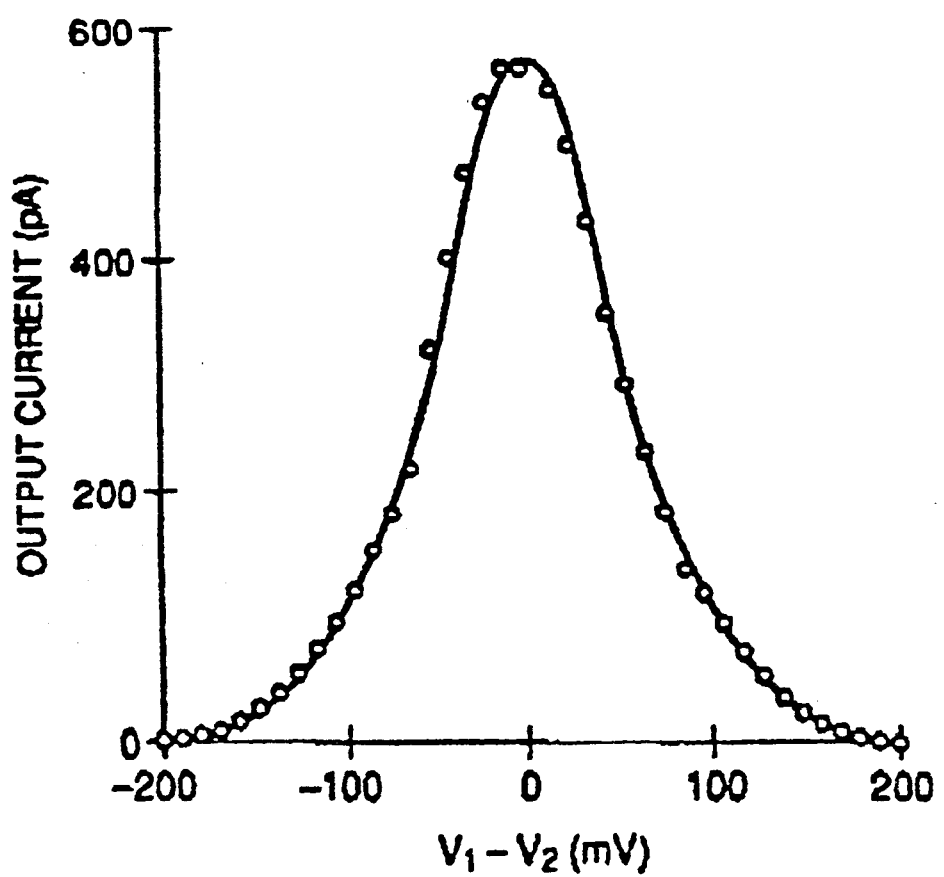

An exemplary one dimensional "bump" circuit is illustrated in FIG. 1a. The circuit comprises first and second transistors 105, 110 and third and fourth transistors 115, 120. A bias current is supplied to the source of transistor 110. In the embodiment shown, the current is supplied by bias transistor 125 as controlled by the bias voltage input 130. Inputs to the circuit are V1 and Vref1 135, 140 and the circuit output 145, a current at the terminal of transistor 105, the output 145 is a value dependent upon the value of $\Delta V = V1 - Vref1$. The output shown in FIG. 1b is a bell shaped curve centered on $\Delta V = 0$, having a maximum height of $KI_b/2$ where $I_b$ is the current through the bias transistor 125. The current output, Iout 145, is mathematically represented by the following equation:

$$I_{out} = \frac{I_0}{1 + \frac{4}{\omega} \cosh^2\left(\frac{k\Delta V}{2}\right)}$$

The exemplary circuit illustrated in FIG. 1a operates in the sub-threshold region. However, the circuit can be modified to operate in the above-threshold region by adding two additional transistors to the correlation portion of the circuit with interchanged gate connections. This is illustrated in FIG. 1c. Although the multidimensional circuit of the present invention is described with respect to sub-threshold operation, it is apparent that the circuit can operate in the sub-threshold and above-threshold regions in accordance with the type of bump circuit utilized.

For further information regarding the bump circuit see Delbrück et al, U.S. Pat. No. 5,099,156, titled "Subthreshold MOS Circuits for Correlating Analog Input Voltages", and Delbrück, "Bump Circuits for Computing Similarity and Dissimilarity of Analog Voltages", California Institute of Technology Computation and Neural Systems Program, CNS Memo No. 10, May 23, 1991.

For learning and other applications, the N-dimensional basis function can implement a smooth error metric for function minimization. It can also be used as a basis function for function interpolation neural networks that operate by summing a collection of basis functions.

Figure 2:
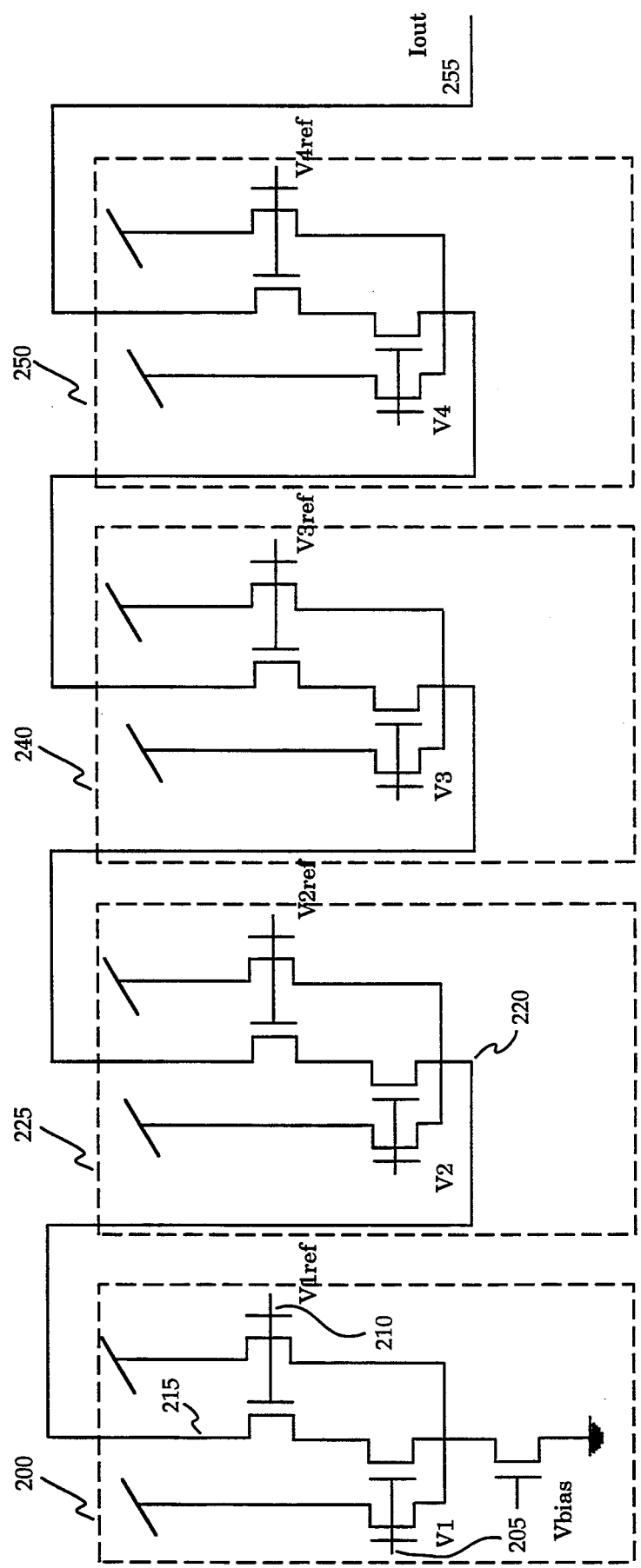
FIG. 2 is a circuit diagram of a first embodiment of the present invention.

The first embodiment of the present invention in shown in FIG. 2. The output current from the one dimensional bump circuit is utilized as the bias current for the next higher dimension bump circuit. Referring to FIG. 2, the first dimension bump circuit 200 has inputs V1 205, a reference voltage V1ref 210 and an output current 215. This output current 215 is used as the input bias current 220 to the bump circuit of the next higher dimension 225. This process is continued for subsequent dimensions 240, 250. The output current 255 of the highest dimension 250 is the current output from multidimensional circuit. The output current 255 is representative of the multiplication of each of the one dimensional basis function 215, 225, 240, 250. While this provides sufficient implementation for some applications, it is desirable to ensure that the bump circuits operate quite similarity in the various dimensions. To achieve this, the difference between the source and drain voltages in each dimension circuit should be of the same value. In addition, it is desirable to provide for a wide range of source and drain voltages; however, in the present embodiment, because each transistor can only accommodate a small voltage difference between source and drain terminals, the amount of current through the transistors is smaller. Therefore, the difference may not be sufficient to operate the transistors in saturation, effectively shortening the range. Furthermore, it is desirable to provide a way to compensate for the voltage drops that occur from circuit to circuit in a long sequence of dimension circuits.

Figure 3:
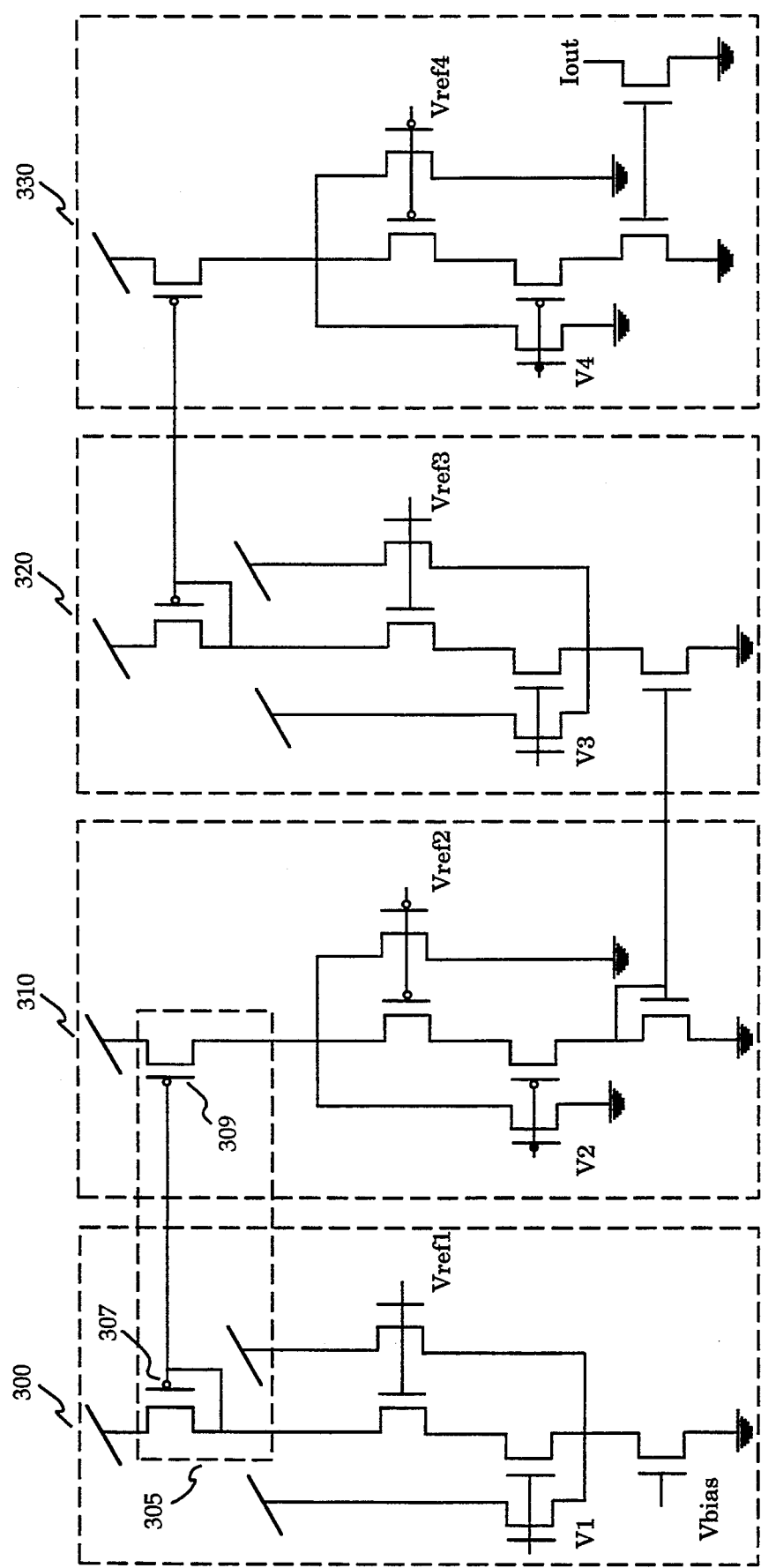
FIG. 3 is a circuit diagram representative of an alternate embodiment of the present invention.

An alternate embodiment is shown in FIG. 3. In this embodiment a current mirror 305 is coupled between each dimension. In particular, a current mirror comprising transistors 307, 309, is coupled between the output current of the lower dimension circuit and the bias input of the higher dimension circuit. To compensate for the orientation of the mirrored current output from the current mirror 305, alternate dimensions of the one dimensional bump circuits are modified in orientation or flipped upside-down and implemented using an alternate type of transistor. In particular, the odd numbered dimension circuits 310, 330, are implemented using PFETS and the even numbered dimensions 300, 320 are implemented using NFETS. Alternately, the odd numbered dimension circuits 310, 330, may be implemented using NFETS and the even numbered dimension circuits 300, 320 may be implemented using PFETS.

Figure 4:
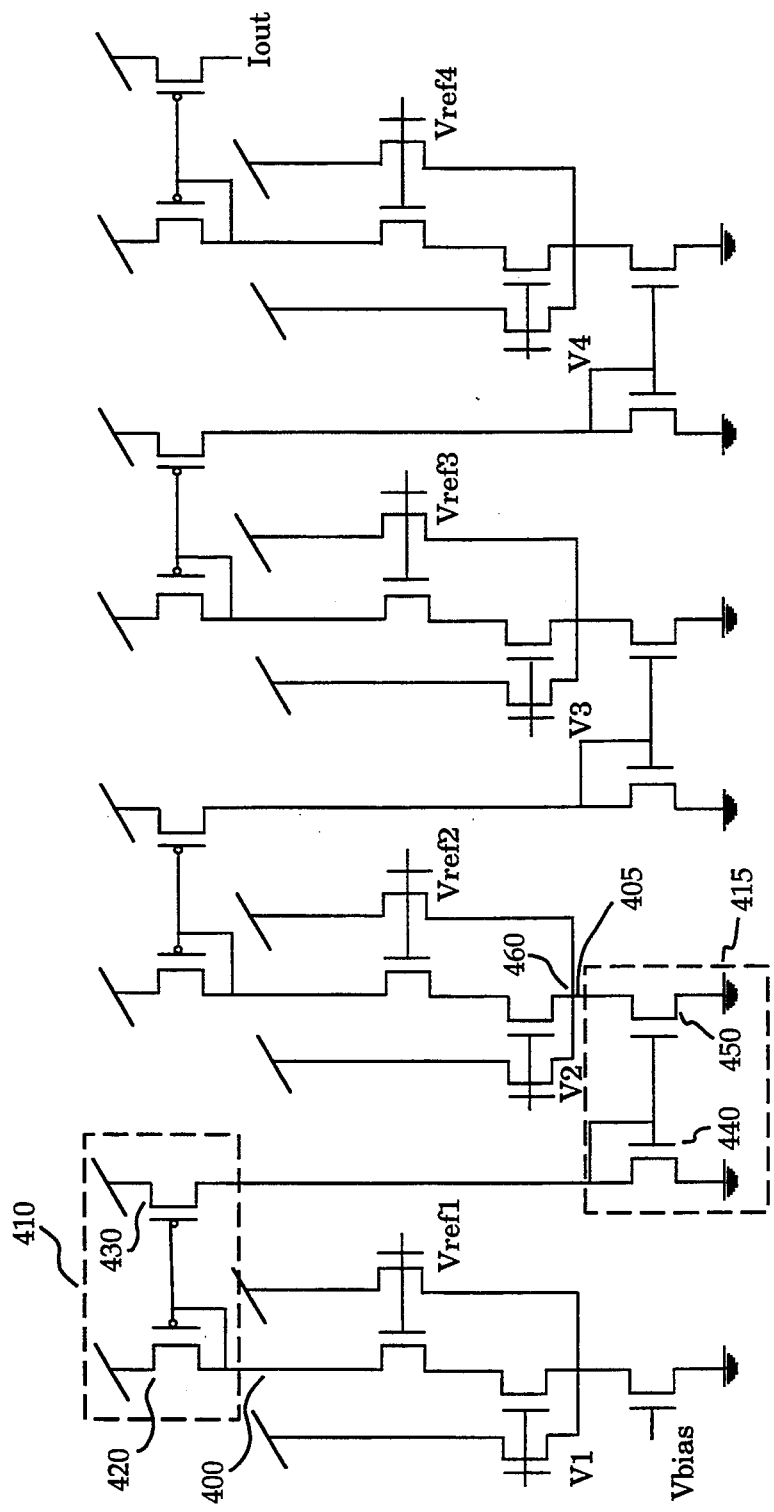
FIG. 4 is circuit diagram representative of a third embodiment of the present invention.

A third alternate embodiment is shown in FIG. 4. In this embodiment the coupling between the current output, Iout 400 of the lower dimension circuit and the bias input 405 at the next higher dimension circuit is achieved using an additional current mirror. The circuit shown implements a four dimensional basis function centered at Vref1, Vref2, Vref3, Vref4, addressed by inputs V1, V2, V3, V4. By providing the additional current mirror, the inputs behaved in a similar manner at each dimension of the circuit. Furthermore, the range of values of voltages for transistor source and drain terminals is extended. Therefore, all of the transistors can operate in saturation, permitting higher current values. It can be seen that the circuit can be extended to an arbitrary number of dimensions by adding the appropriate number of stages.

The two-stage current mirror, 410, 415 comprises four transistors 420, 430, 440, 450 wherein the source terminal of gate 430 and source terminal of transistor 420 are coupled to a fixed voltage source such as VDD voltage rail. The drain terminal of transistor 430 is coupled to the gate terminal and the drain terminal of transistor 440 and the gate terminal of transistor 450. The source terminal of transistor 450 is connected to ground and the drain terminal is connected to bias input node 460.

The two-stage current mirror is utilized to generate a proportional current for biasing the adjacent higher dimensional circuit. Therefore, the problems associated with circuits of high dimensions in which some loss in current is realized across multiple dimensions is eliminated. As will be apparent to one skilled in the art, other types of current copying or conveying mechanisms may be utilized as coupling means between each dimension of the bump circuit.

If the circuit is to be used to evaluate basis functions in higher dimensional spaces, it is preferable to use the embodiment described in FIG. 4. In a low dimensional space, a basis function occupies a significant amount of volume in that space. However, as dimensionality increases, the basis function occupies an increasingly small fraction of the volume in that space. This occurs because the parameters of any one dimension can cause the output to be small (e.g., if V1 is significantly different from Vref1 the output current will be small regardless of the values of the voltage inputs for the higher dimensions V2, V3, etc.). This will be evident if the basis functions utilized represent an error metric function wherein the frequency of occurrence of values which greatly differ from the reference values is high. If the parameter is out of range, no output signal is generated. Therefore it would be preferable to use the embodiment set forth in FIG. 5.

Figure 5:
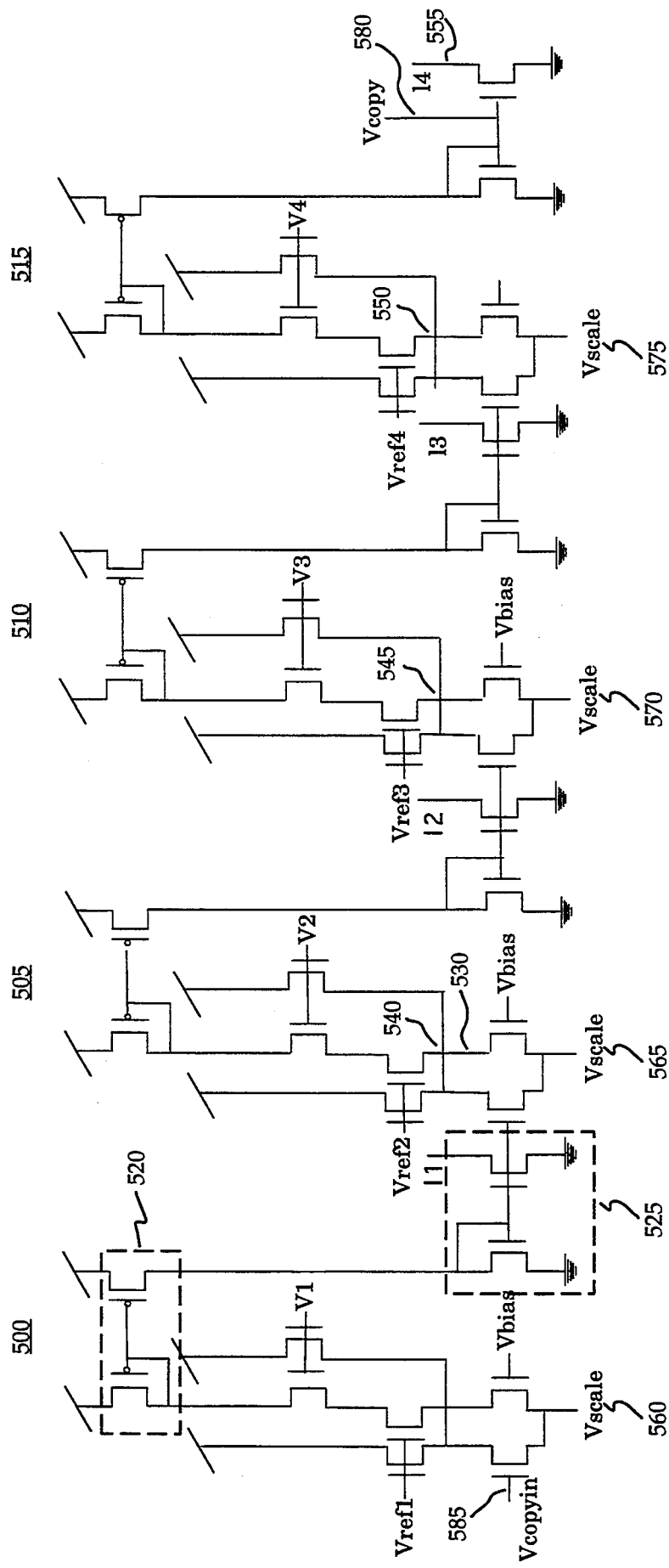
FIG. 5 is a circuit diagram representative of a fourth embodiment of the present invention.

Referring to FIG. 5, a bias current 530 is added to the output of each current mirror 520, 525. Thus, at each bias input node 540, 545, 550 and at each higher dimension circuit 505, 510, 515 there are two inputs, the output of the current mirror and the bias current. In the embodiment shown in FIG. 5, the output current 555 of the highest dimension circuit 515 is determined as the sum of the individual output currents from each of the dimensions.

Furthermore, it is preferred that the circuit is closed by connecting the voltage output Vcopy 580 to the input Vcopy 585 at the first dimension circuit 500. This permits the current to be copied from the highest dimension circuit back to the lowest dimension circuit and removes some of the dependence on the order of connection of the individual bump circuits. Preferably, the amount of bias current applied at each dimension 500, 505, 510, 515 is controllable via a scale factor shown as Vscale 560, 565, 570, 575. By varying the parameters including Vscale, the circuit produces a response somewhere between that of a purely multiplied basis function and the response of a set of separate bump circuits added together.

Figure 6:
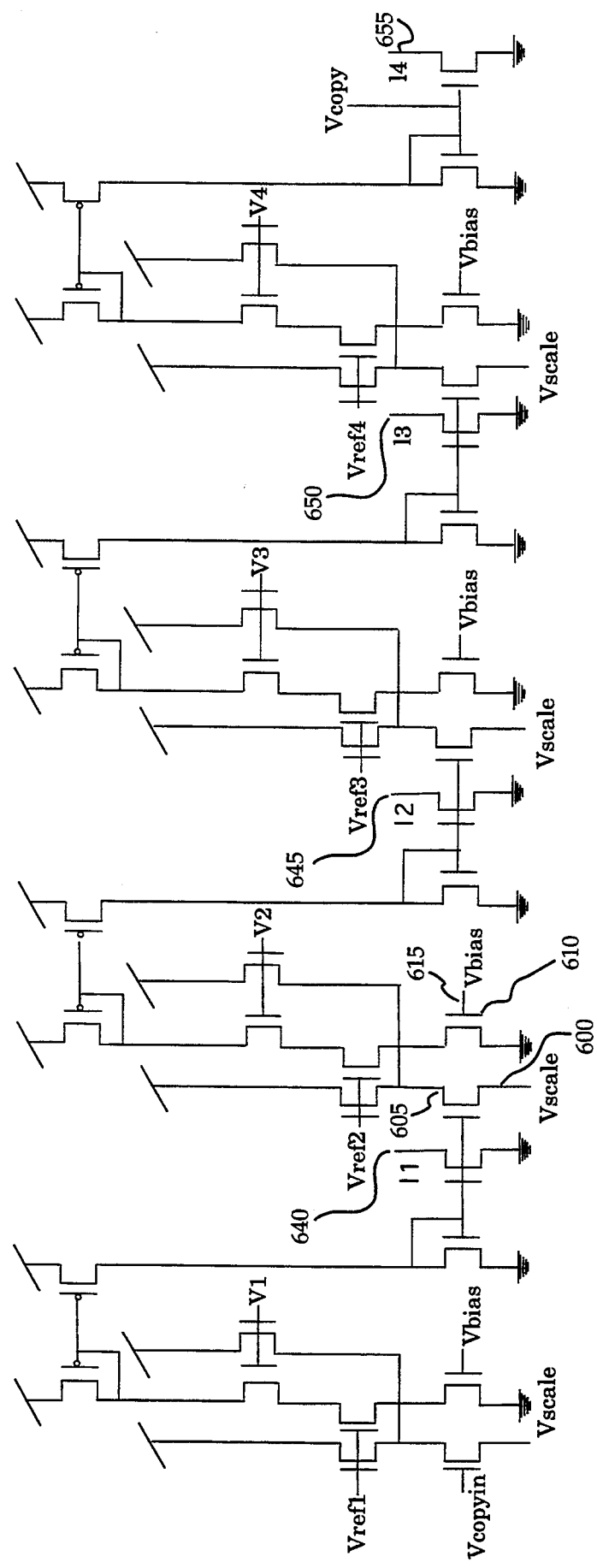
FIG. 6 is a circuit diagram representative of a fifth embodiment of the present innovation.

In an alternate embodiment, shown in FIG. 6, the amount of current copied via the current mirror is controllable via a scale factor as dictated by a voltage input Vscale to the drain terminal 600 of transistor 605. However, Vscale is not connected to the bias current transistor 610 which generates an independent supplemental bias current based upon the bias voltage Vbias 615. Therefore, Vscale does not affect the amount of current injected by the Vbias transistor 610. By maintaining the bias current independent of the scale factor and varying the input parameters, a smooth varying circuit response between multiplying the functions together and adding them can be achieved. For example, if Vscale is raised significantly above ground, each dimension circuit is isolated from adjacent dimension circuits. This is due to the fact that little current is copied via the current mirror. Thus, the output currents I1, I2, I3, I4, 640, 645, 650, 655, are very similar to values generated using individual bump circuits having the corresponding voltage input values. The sum of the individual current outputs can be added together to produce an output current which is similar to four one dimensional bump circuits.

If Vscale is small or below ground value, then the copied current becomes significant and is combined with the bias current at the biased input node. In order to achieve a multiplication of the different dimensions, the Vbias value for the first dimension circuit is set to a non-zero value and Vbias value for the higher dimension circuits is set to near-zero. Most of the current to the bias input node is transferred from one dimension to the next dimension through the current mirrors. Thus, the resultant current output I4, 655 is very similar to the multiplication of the four current output values I1, I2, I3, I4. Therefore, through manipulation of the parameters Vbias, Vscale, responses between that of multiplying the individual dimension basis functions and adding the basis functions can be generated. This functionality further provides for generating a partial projection of the N-dimensional basis function onto a lower dimensional space.

Figure 7:
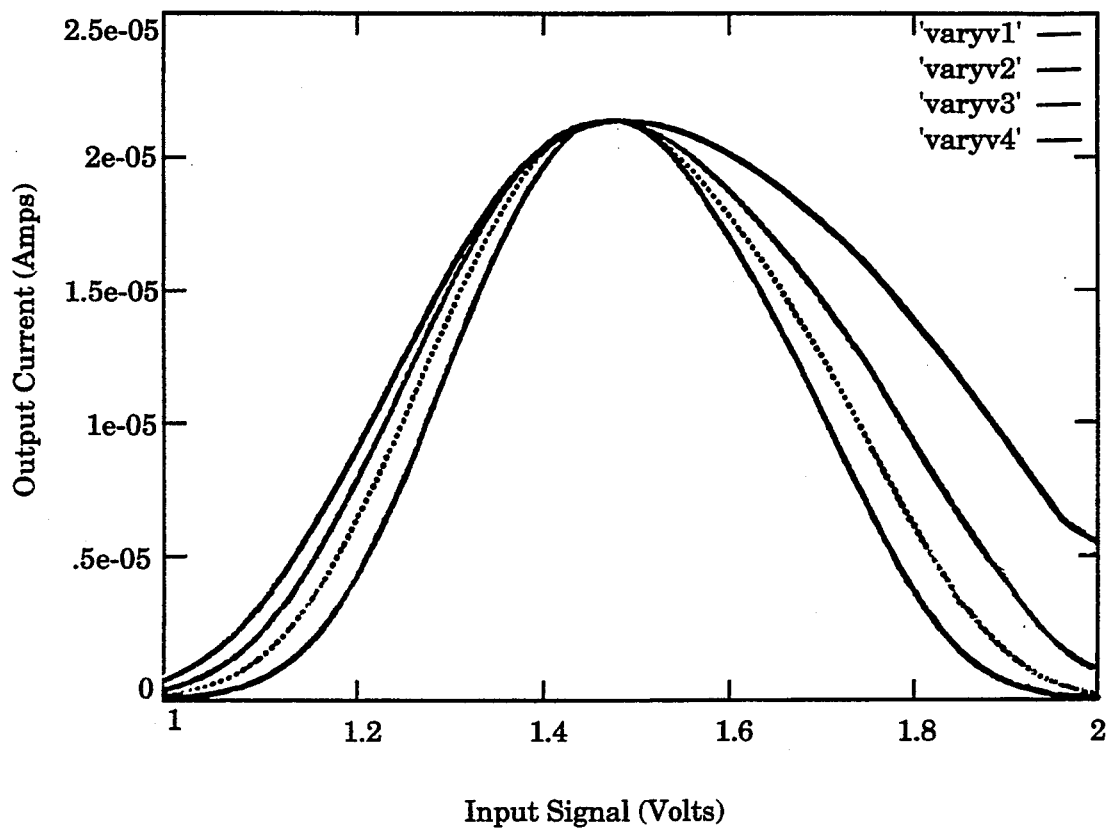
FIG. 7 is a plot illustrating the simulation of a four dimensional implementation of the multi-dimensional bump circuit of the present invention.

FIG. 7 is illustrative of a simulation of a four dimensional implementation of an N-dimensional bump circuit of the present invention. The four curves represent the response as one of the four input parameters, V1, V2, V3, V4 is varied. The reference values, Vref1, Vref2, Vref3, Vref4 are held at 1.5 volts.

Although the present invention has been described in light of the preferred embodiment, it will be apparent that numerous alternatives, modifications, variations and uses will be apparent to those skilled in the art in light of the foregoing description.

What is claimed is:

1. A circuit for computing a basis function in n-dimensions, where n is greater than one, comprising:
   a first sub-circuit representative of a first dimension for evaluating a one-dimensional basis function to produce a measure of similarity or dissimilarity between two input signals, said first sub-circuit having an output current and voltage; and
   at least one additional sub-circuit representative of additional dimensions for evaluating a one-dimensional basis functions to produce a measure of similarity or dissimilarity between two input signals, a first additional sub-circuit coupled via a coupling means to the first sub-circuit, subsequent additional sub-circuits coupled in series to prior additional sub-circuits, wherein the output current of the first sub-circuit and prior additional sub-circuits respectively provide a bias current to coupled additional sub-circuits.

2. The circuit as set forth in claim 1, wherein the coupling means comprises a current mirror.

3. The circuit as set forth in claim 2 wherein said coupling means further comprises a bias current added to the current copied from a sub-circuit current output for input to the coupled sub-circuit input.

4. The circuit as set forth in claim 3 wherein the current copied and the bias current is controllable in accordance with a scale factor which scales the current copied from a sub-circuit current output and the bias current for input to the coupled sub-circuit input.

5. The circuit as set forth in claim 2, wherein the output current from the current mirror is controllable via a scale factor which scales the current copied from a sub-circuit current output for input to the coupled sub-circuit input.

6. The circuit as set forth in claim 5, wherein said coupling means further comprises a bias current added to the scaled current for input to the coupled sub-circuit input.

7. The circuit as set forth in claim 1, wherein said first sub-circuit comprises pfet transistors, said odd numbered additional sub-circuits comprising nfet transistors, and said even numbered additional sub-circuits comprising pfet transistors.

8. The circuit as set forth in claim 1, wherein said first sub-circuit comprises nfet transistors, said odd numbered additional sub-circuit comprising pfet transistors, and said even numbered additional sub-circuits comprising nfet transistors.

9. The circuit as set forth in claim 1, wherein said sub-circuits comprise a plurality of transistors operating in the sub-threshold region.

10. The circuit as set forth in claim 1, wherein said sub-circuits comprise a plurality of transistors operating in the above-threshold region.

11. The circuit as set forth in claim 1, wherein the sub-circuit comprises:
   a first voltage input node;
   a second voltage input node;
   a fixed voltage source input node;
   a fixed bias input node;
   a first MOS transistor, having a first and second main terminals and a control terminal, the control terminal coupled to the first voltage input node and the first main terminal coupled to the fixed voltage source input node and a current output node at which current is output from the sub-circuit;

a second MOS transistor, having a first and second main terminals and a control terminal, the control terminal coupled to the second voltage input node, the first main terminal coupled to the second main terminal of the first MOS transistor and the second main terminal coupled to the fixed bias input node;

a third MOS transistor having a first and second main terminals and a control terminal, said control terminal coupled to the first voltage input node, said first main terminal coupled to the fixed voltage source input node, and said second main terminal coupled to the fixed bias input node, an input bias current applied to the fixed bias input node of the first dimension sub-circuit; and a fourth MOS transistor, having a first and second main terminals and a control terminal, the control terminal coupled to the second voltage input node and said first main terminal coupled to the fixed voltage source input node, and said second main terminal coupled to the fixed bias input node;

said current output node located at the first main terminal of the first MOS transistor and provides the input bias current at the fixed bias input node of additional sub-circuits.

12. The circuit as set forth in claim 11, wherein said coupling means comprises a current mirror coupled between the current output node and the fixed bias input node.

13. The circuit as set forth in claim 12, wherein said current mirror comprises:

a fifth MOS transistor having a first and second main terminals and a control terminal, said first main terminal coupled to the fixed voltage source input node;

a sixth MOS transistor having a first and second main terminals and a control terminal, the control terminal coupled to the second main terminal and control terminal of the fifth MOS transistor, and said first main terminal coupled to the fixed voltage source input node;

a seventh MOS transistor having a first and second main terminals and a control terminal, the control terminal and the first main terminal coupled to the second main terminal of the sixth MOS transistor, and said second main terminal coupled to ground;

an eighth MOS transistor having a first and second main terminals and a control terminal, the control terminal coupled to the first main terminal and control terminal of the seventh MOS transistor, said second main terminal coupled to ground.

14. The circuit as set forth in claim 13, wherein said coupling means further comprises:

a current scale means for scaling the amount of current input by the current mirror to the fixed bias input node; and a bias current input coupled to each additional sub-circuit, said bias current input coupled to the fixed bias input node.

15. The circuit as set forth in claim 14, wherein: said current scale means comprises;

a ninth MOS transistor having a first and second main terminals and a control terminal, the control terminal coupled to the control terminal of the eighth MOS transistor;

an input voltage scale, said scale coupled to the second main terminal of the ninth transistor;

said bias current input comprising a tenth MOS transistor having a control terminal and a first and second main terminal, said control terminal coupled to an input bias voltage;

said coupling means further comprising a second coupling between the first main terminal of the ninth MOS transistor and the fixed bias input node.

16. The circuit as set forth in claim 15, wherein said second main terminal of the tenth MOS transistor is coupled to the input voltage scale.

17. The circuit as set forth in claim 15, wherein said second main terminal of the tenth MOS transistor is coupled to ground.

18. The circuit as set forth in claim 15, wherein the n-dimension sub-circuit further comprises a voltage copy output node coupled between the control terminals of the seventh and eighth MOS transistors, said voltage copy output node coupled to the first current input node of the first sub-circuit.

19. A method for computing a basis function in n-dimensions, where n is greater than one, comprising steps of:

evaluating a one-dimensional basis function for a first dimension to produce a measure of similarity or dissimilarity between two input voltages, comprising the steps of;

inputting a first and second voltage input and a bias current input, and generating an output current representative of a measure of similarity or dissimilarity the two input voltages;

coupling the output current to a bias current input for computing additional dimensions of a measure of similarity or dissimilarity between two input voltages; and computing for additional dimensions a measure of similarity or dissimilarity between two input voltages, comprising the steps of;

receiving a first and second voltage input for each additional dimension, receiving the output current from the lower adjacent dimension as a bias current input for each dimension, and generating an output current representative of a measure of similarity or dissimilarity between the two input voltages for each additional dimension;

said first additional sub-circuit coupled to the first sub-circuit and subsequent additional sub-circuits coupled in series to adjacent additional sub-circuits.

20. The method as set forth in claim 19, wherein the step of coupling comprises mirroring the current using a current mirror.

21. The method as set forth in claim 20, further comprising the step of adding a second bias current to the mirrored current.

22. The method as set forth in claim 21 further comprising the step of controlling the amount of mirrored current and bias current input to the bias current input in accordance with a scale factor.

23. The method as set forth in claim 19, further comprising the step of controlling the amount of mirrored output current input to the bias current input in accordance with a scale factor.

24. The method as set forth in claim 23, further comprising the step of adding a second bias current to the scaled mirrored current.

* * * * *